United States Patent [19]
Jenq et al.

[11] Patent Number: 5,874,334
[45] Date of Patent: Feb. 23, 1999

[54] METHOD FOR FABRICATING DRAM CAPACITOR

[75] Inventors: Jason Jenq, Pingtung; Sun-Chieh Chien, Hsinchu, both of Taiwan

[73] Assignee: United Microelectronics Corp., Hsin-Chu, Taiwan

[21] Appl. No.: 8,900

[22] Filed: Jan. 20, 1998

[30] Foreign Application Priority Data

Oct. 29, 1997 [TW] Taiwan ................................ 86116031

[51] Int. Cl.$^6$ ............................................ H01L 21/8242
[52] U.S. Cl. ............................................ 438/253; 438/255
[58] Field of Search ..................... 438/253–256, 438/396–399

[56] References Cited

U.S. PATENT DOCUMENTS 5,706,164  1/1998  Jeng .
5,710,073  1/1998  Jeng et al. .

Primary Examiner—Jey Tsai
Attorney, Agent, or Firm—Merchant, Gould, Smith, Edell, Welter & Schmidt, P.A.

[57] ABSTRACT

A method for fabricating a DRAM capacitor comprising the steps of forming silicon nitride spacers twice, not only serving as etching stop layer in a self-aligned contact etching process, but also used as a protective layer for the bit line and gate electrode in an etching operation. In another aspect, using silicon nitride spacers has the advantage of being capable of increasing the width of a contact opening. Hence, a contact opening having a smaller height to width ratio can be produced. Furthermore, the lower electrode of the capacitor in this invention is a pillar-shaped structure, and together with the formation of a hemispherical grained silicon layer over the lower electrode, the surface area of the capacitor can be greatly increased. Moreover, a dielectric layer having a high dielectric constant can be used; hence, a capacitor with sufficient capacitance can be provided although the surface area of the storage capacitor is reduced.

25 Claims, 10 Drawing Sheets

METHOD FOR FABRICATING DRAM CAPACITOR

BACKGROUND OF THE INVENTION

1. Field of Invention

The present invention relates to a method for fabricating semiconductor devices. More particularly, the present invention relates to a method for fabricating a dynamic random access memory (DRAM) capacitor.

2. Description of Related Art

DRAMs are now extensively used in all kinds of integrated circuit devices. They have become an indispensable element in the electronic industries. FIG. 1 illustrates a circuit diagram of a memory unit of a DRAM device. As shown in FIG. 1, the memory unit comprises a pass transistor T and a storage capacitor C. The source terminal of the pass transistor T is connected to a bit line (BL) and the drain terminal is connected to a storage electrode 6 of the storage capacitor C. The gate terminal of the pass transistor T is connected to a word line (WL). The opposed electrode 8 of the storage capacitor C is connected to a fixed voltage source. Between the storage electrode 6 and the opposed electrode 8, there is a dielectric layer 7. Those who are familiar with the art of semiconductor manufacturing may know that the capacitor C functions as a storage place for digital data. Therefore, the capacitor C should have a sufficiently large capacitance to avoid rapid data loss.

In the fabrication of conventional DRAMs with a memory capacity up to about 1 MB, a two dimensional capacitor device, generally know as a planar-type capacitor, is often employed for the storing digital data. In a conventional planar-type DRAM capacitor, as shown in FIG. 2, a silicon substrate 10 is provided first. Then, a field oxide layer 11 is formed on the substrate 10 to define the active regions. Next, a gate oxide layer 12, a gate layer 13 and source/drain regions 14 are sequentially formed above the substrate 10, constituting a pass transistor T. In a subsequent step, a dielectric layer 7 and a conducting layer 8 are sequentially formed over portions of the substrate near the drain terminal. The region 6 where the dielectric layer 7 and the conducting layer 8 overlap the substrate 10 forms a storage capacitor C. For the planar-type capacitor structure described, a relatively large surface area is required to form a storage capacitor C that has sufficient capacitance. Hence, this design is unsuitable for DRAM devices with high-level integration.

In general, highly integrated DRAMs, for example, those larger than about 4 MB memory capacity, require a three-dimensional capacitor structure, such as a stack-type or a trench-type structure, for the capacitor devices.

FIG. 3 is a cross-sectional view of a conventional stack-type capacitor structure. As shown in FIG. 3, a field oxide layer 11, a gate oxide layer 12, a gate layer 13 and source/drain regions 14 are sequentially formed over a substrate 10, which constitute a pass transistor T. Thereafter, an insulating layer 15 is formed on the substrate 10, and then a contact opening 14 is etched out exposing portions of a source/drain region 14. Subsequently, a polysilicon layer 6 (serving as the storage electrode), a dielectric layer 7 and a conducting layer 8 (serving as the opposed electrode) are sequentially formed over the contact opening 14. This produces a stack-type DRAM capacitor memory unit. The above stack-type capacitor structure is capable of supplying sufficiently large amount of capacitance with relatively good device reliability. However, for higher level of integration, such as in a 64 MB or larger storage capacity DRAM, a simple stack-type capacitor is insufficient.

Another technique for increasing the capacitance is to produce a trench-type capacitor. FIG. 4 is a cross-sectional view of a conventional trench-type capacitor structure. As shown in FIG. 4, processes very similar to the fabrication of a stack-type capacitor are performed first to produce a pass transistor T on a silicon substrate 10. The pass transistor T includes a gate oxide layer 12, a gate layer 13 and source/drain regions 14. Thereafter, a deep trench is formed by etching the substrate 10 near the drain terminal 14, and a storage capacitor C is formed inside the trench region. The storage capacitor C is formed on the sidewalls of the trench. The capacitor C comprises a storage electrode 6, a dielectric layer 7 and a polysilicon opposed electrode 8. The above trench-type capacitor has a larger surface area of the electrode and hence larger capacitance. However, etching the substrate 10 to form a trench may cause some damages to the crystal lattice structure, and more current may leak thereby affecting the operation of the device. Furthermore, as an aspect ratio of the trench increases, the etching rate will correspondingly decrease, therefore, fabrication becomes more difficult and time consuming.

In light of the foregoing, there is a need for an improved method for fabricating a DRAM capacitor with larger capacitance.

SUMMARY OF THE INVENTION

Accordingly, the present invention is directed to provide a method for fabricating a DRAM capacitor that can maintain sufficient capacitance on a small wafer surface.

To achieve these and other advantages and in accordance with the purpose of the invention, as embodied and broadly described herein, the invention provides a method for fabricating a DRAM capacitor. The method comprises the steps of forming a transistor above a semiconductor substrate first. The transistor includes source/drain regions and a gate electrode, wherein the gate electrode comprises a first polysilicon layer, a tungsten silicide layer and a first silicon nitride layer. Furthermore, first spacers are formed on the sidewalls of the transistor, wherein the first spacers are formed from silicon nitride material. Next, a first oxide layer is formed over the transistor, and then the first oxide layer is patterned to form a contact opening exposing the drain region of the transistor. Thereafter, a bit line is formed having connection with the drain region exposed through the contact opening. The bit line includes a second polysilicon layer, a tungsten silicide layer and a second silicon nitride layer. Then, second spacers are formed on the sidewalls of the bit line, wherein the second spacers are made from silicon nitride material. Subsequently, a third silicon nitride layer and a second oxide layer are sequentially formed over the second silicon nitride layer, the second spacers and the first oxide layer. The third silicon nitride layer and the second oxide layer are then patterned to form a contact opening exposing the source region of the transistor.

Thereafter, a polysilicon plug is formed in the contact opening for linking with the exposed source region. Then, a third oxide layer is formed over the polysilicon plug. Next, the third oxide layer and the second oxide layer beneath are patterned to form pillar-shaped structures. In the subsequent step, a third polysilicon layer is formed over the pillar-shaped structures.

Next, the polysilicon layer on the top of the pillar structures is removed until the pillar-structure itself is exposed. Then, the pillar structure, which comprises the third and the second oxide layers, is removed from the third polysilicon layer to form the lower electrode. Therefore, the lower electrode also has a pillar-shaped structure. Finally, a dielectric layer is formed over the lower electrode, and then a fourth polysilicon layer is formed over the dielectric layer acting as the upper electrode.

In this invention, silicon nitride spacers are employed twice not only as an etching stop layer, but is also used as a protective layer for the bit line and the gate electrode during an etching operation. Furthermore, since the etching of the contact opening is a self-aligned process, misalignment due to defocusing can be largely avoided.

In another aspect, using silicon nitride spacers has the advantage of being capable of increasing the width of a contact opening. Hence, a contact opening having a smaller height to width ratio can be produced.

In yet another aspect, the formation of hemispherical grained silicon layer over the pillar-shaped lower electrode allows a lower electrode with a large surface area. If a tantalum oxide dielectric layer is also used, the capacitance of the capacitor can be increased considerably. Therefore, a capacitor with sufficient capacitance can still be provided even when the surface area for forming the storage capacitor is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
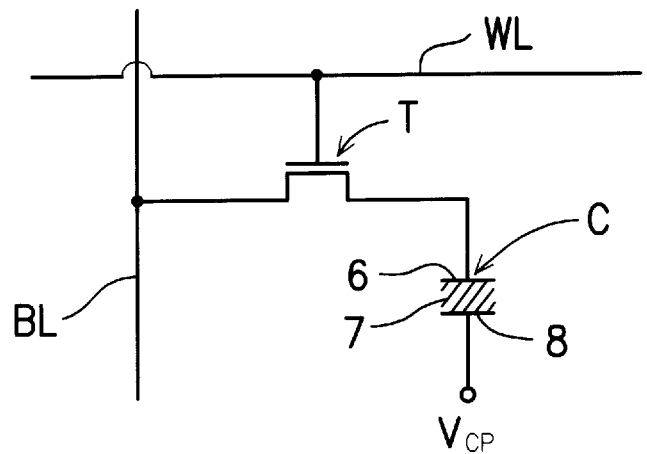
FIG. 1 is the circuit diagram of a memory unit of a DRAM device.
Figure 2:
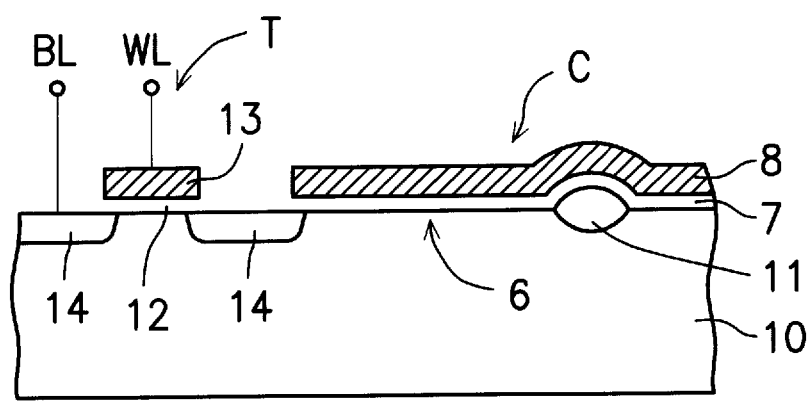
FIG. 2 is a cross-sectional view of a conventional planar-type DRAM capacitor.
Figure 3:
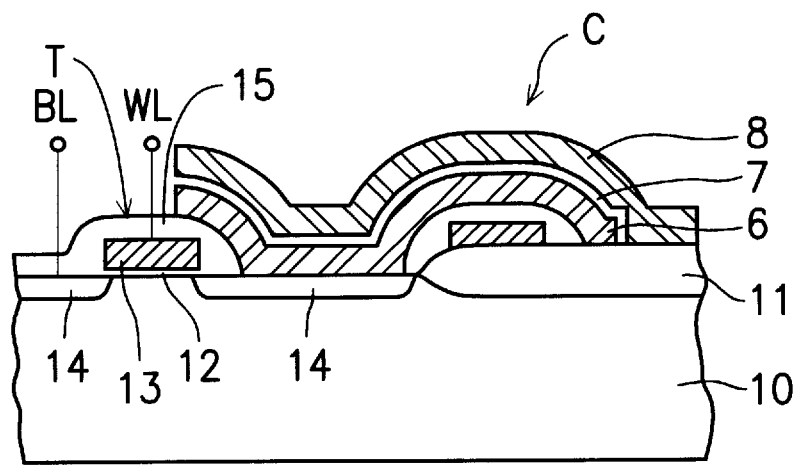
FIG. 3 is a cross-sectional view of a conventional stack-type capacitor structure.
Figure 4:
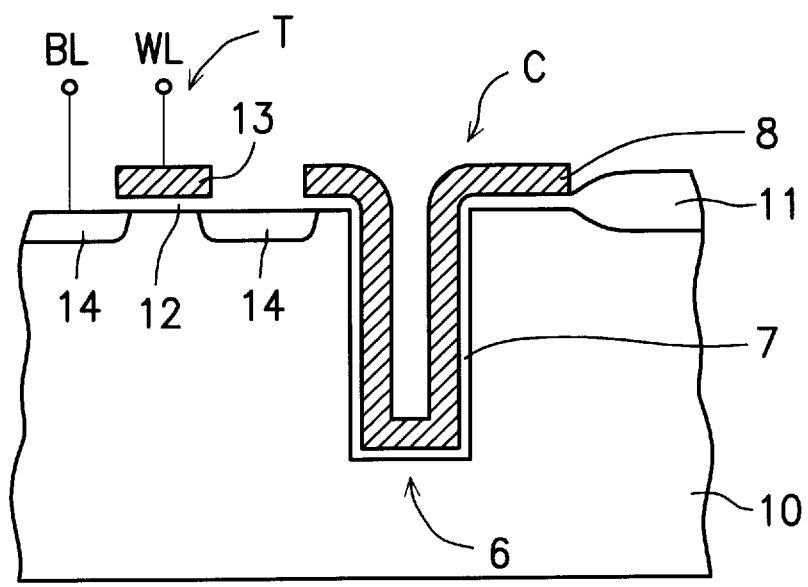
FIG. 4 is a cross-sectional view of a conventional trench-type capacitor structure.

Reference will now be made in detail to the present preferred embodiments of the invention, examples of which are illustrated in the accompanying drawings. Wherever possible, the same reference numbers are used in the drawings and the description to refer to the same or like parts.

Figure 5A:
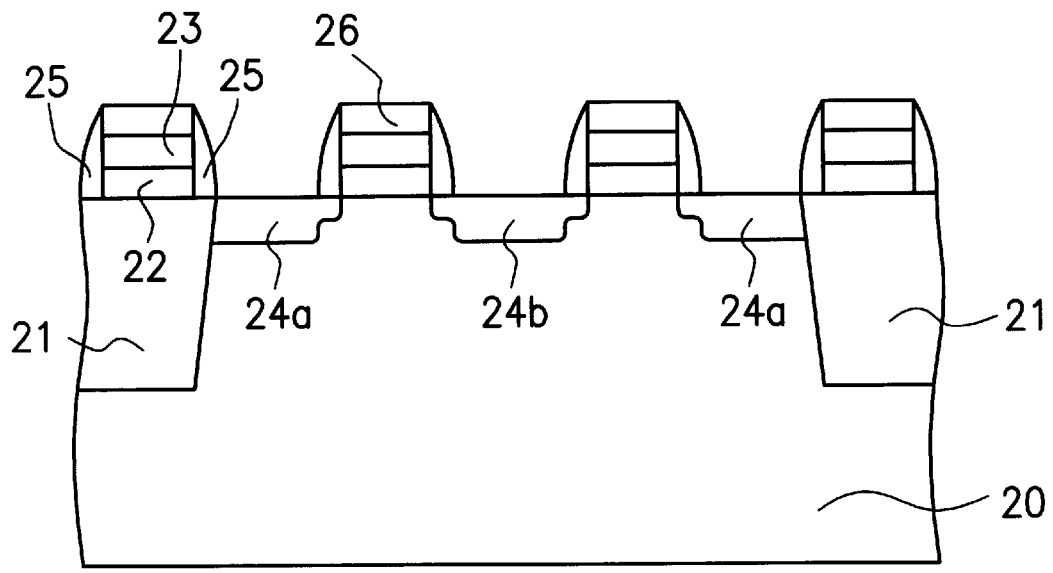
FIG. 5A through 5P are cross-sectional views showing the progression of manufacturing steps for forming a DRAM capacitor according to one preferred embodiment of this invention.
Figure 5B:
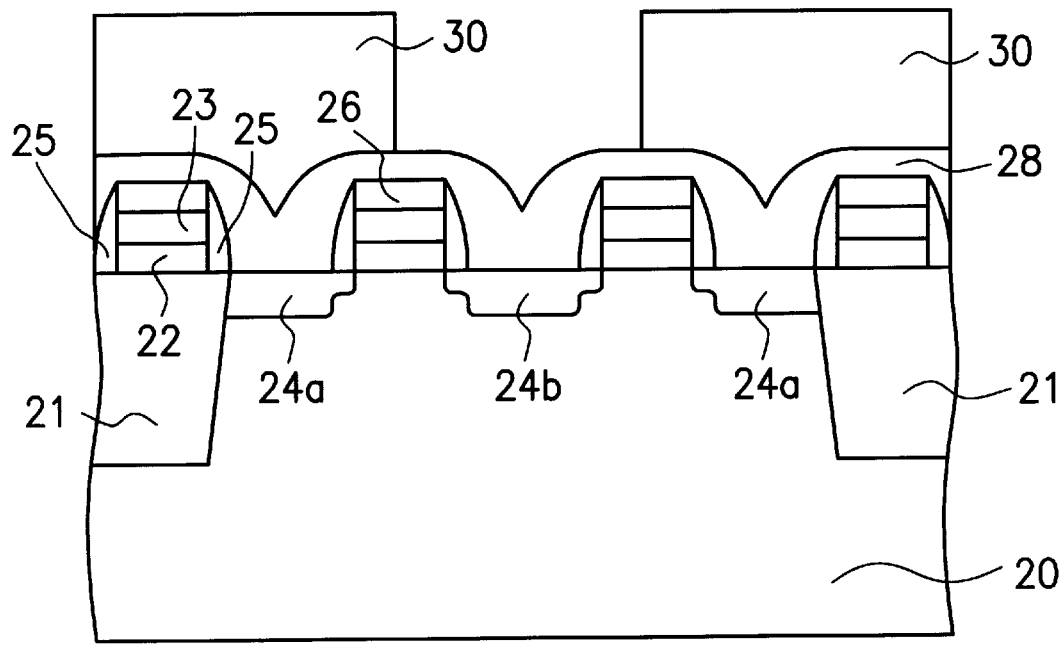
Figure 5C:
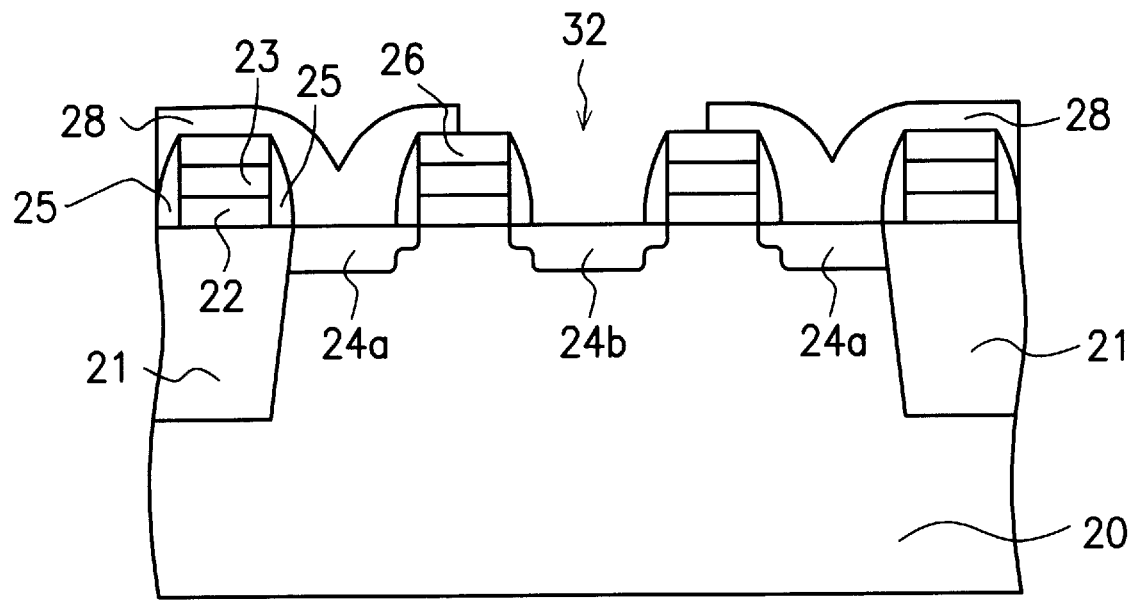
Figure 5D:
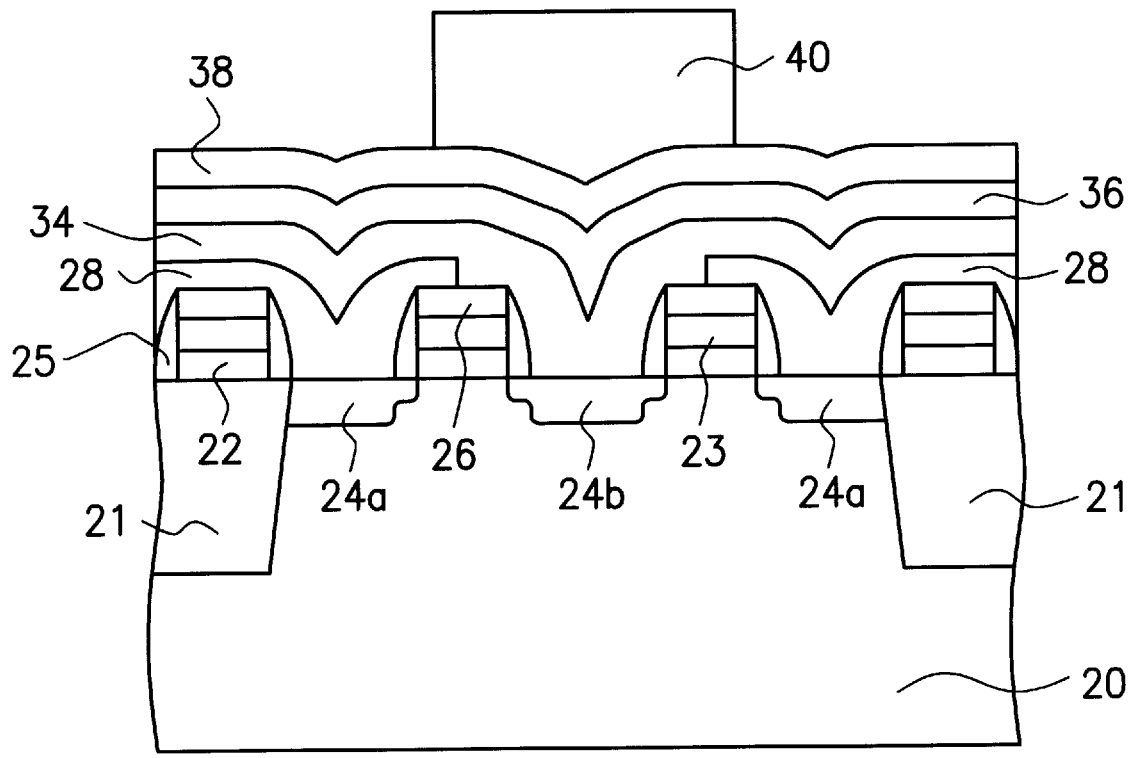
Figure 5E:
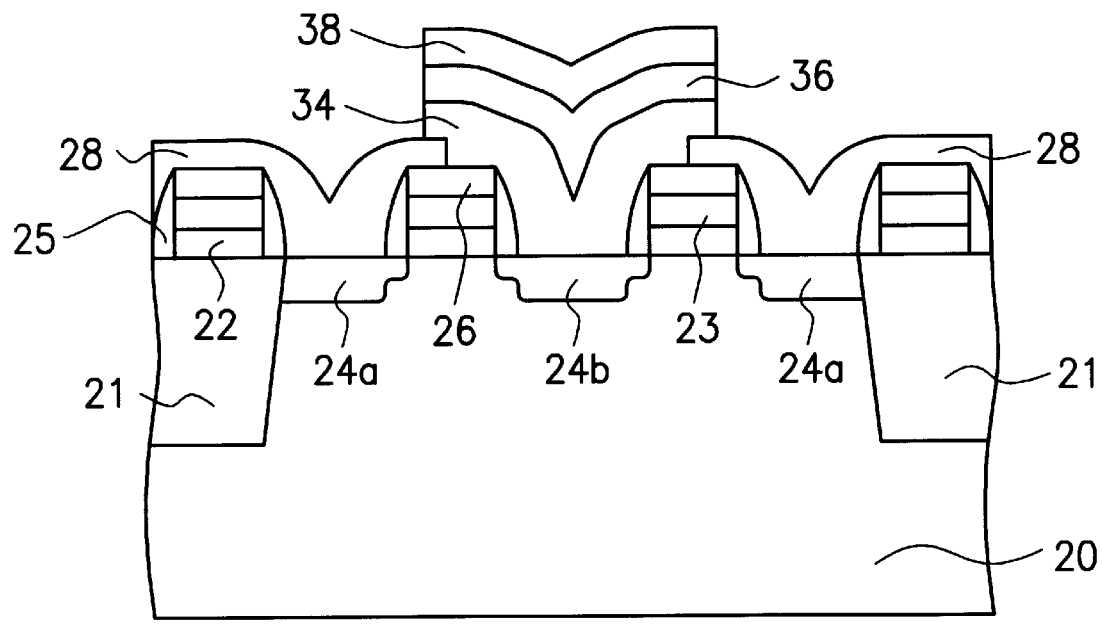
Figure 5F:
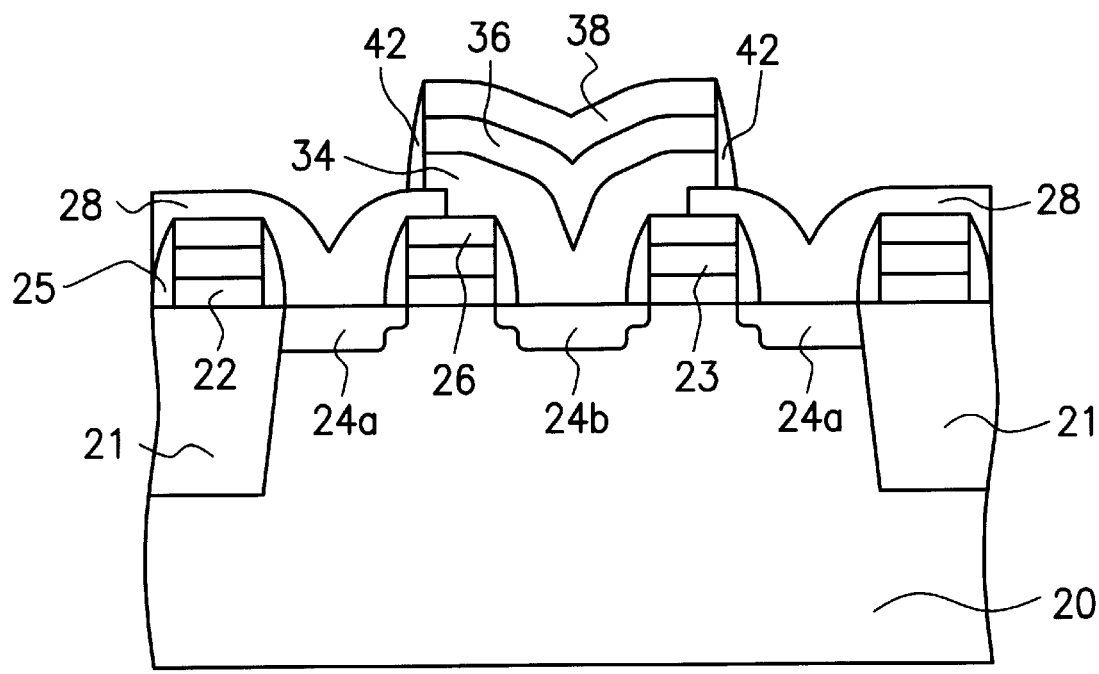
Figure 5G:
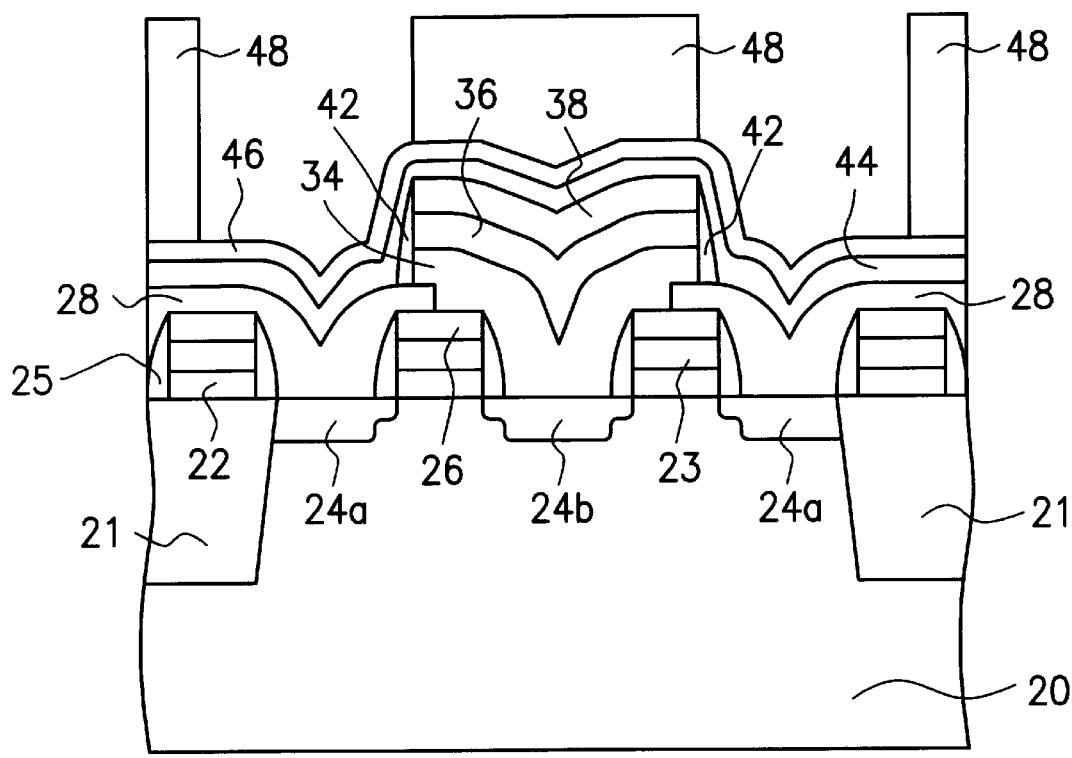
Figure 5H:
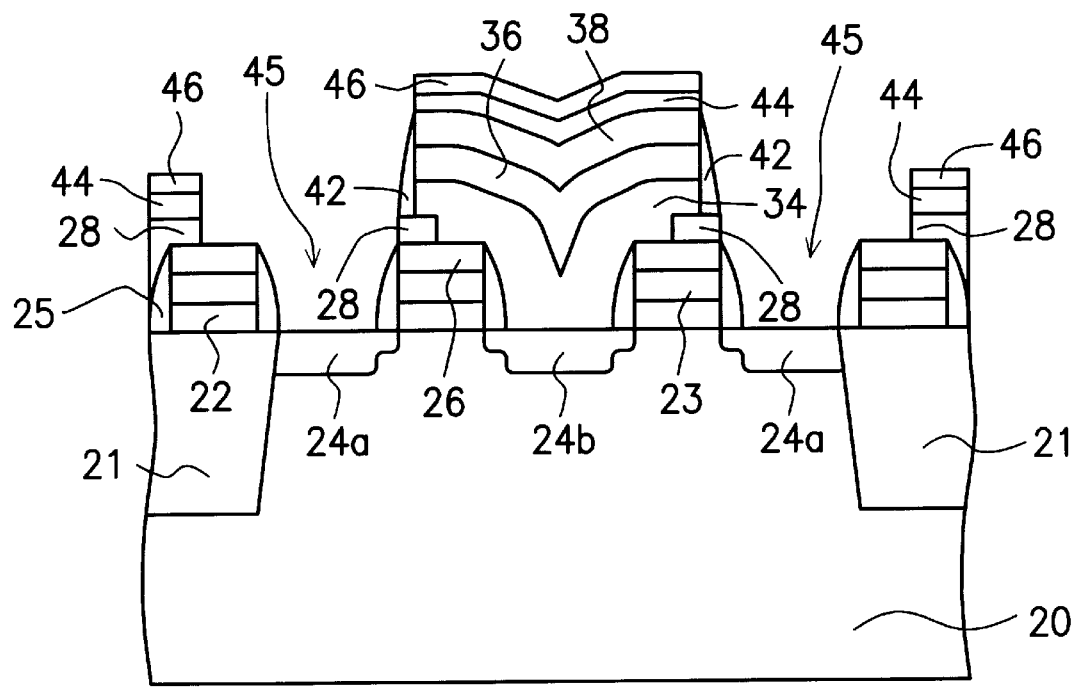
Figure 5I:
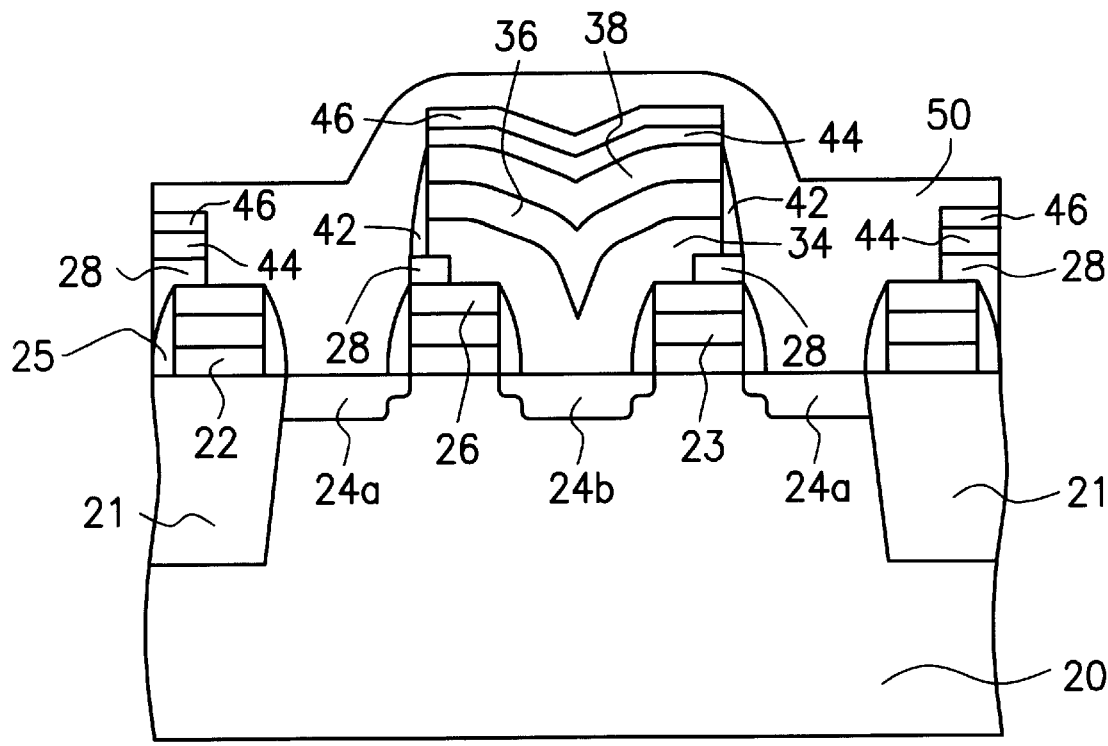
Figure 5J:
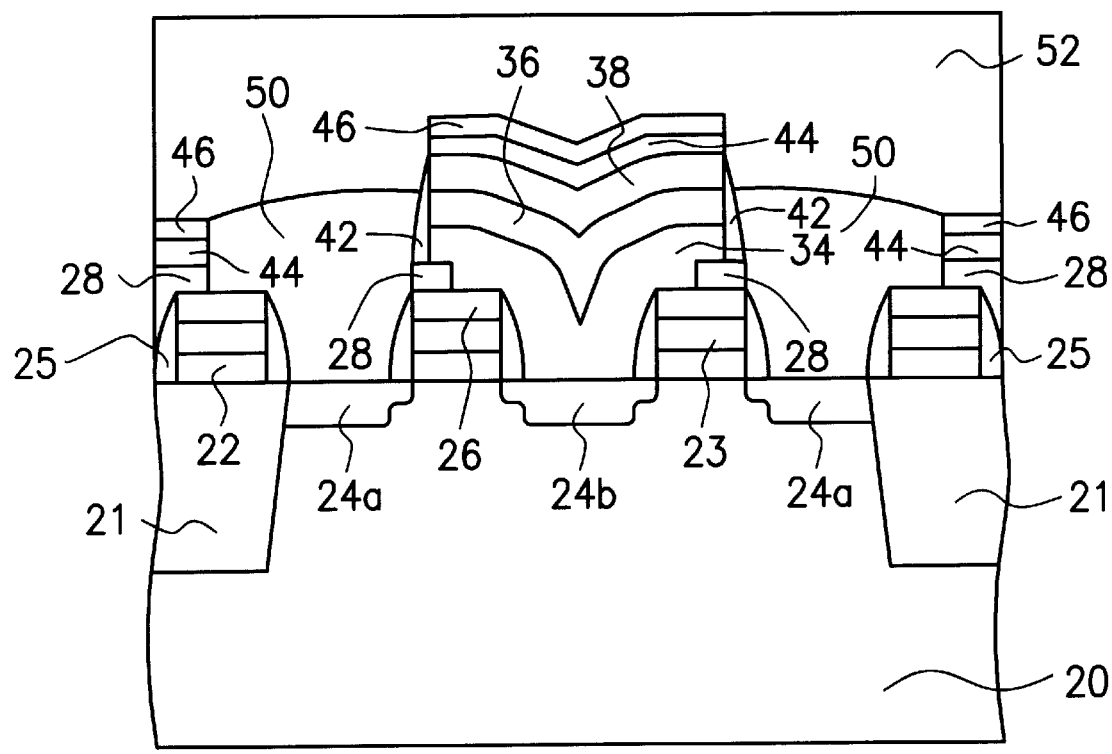
Figure 5K:
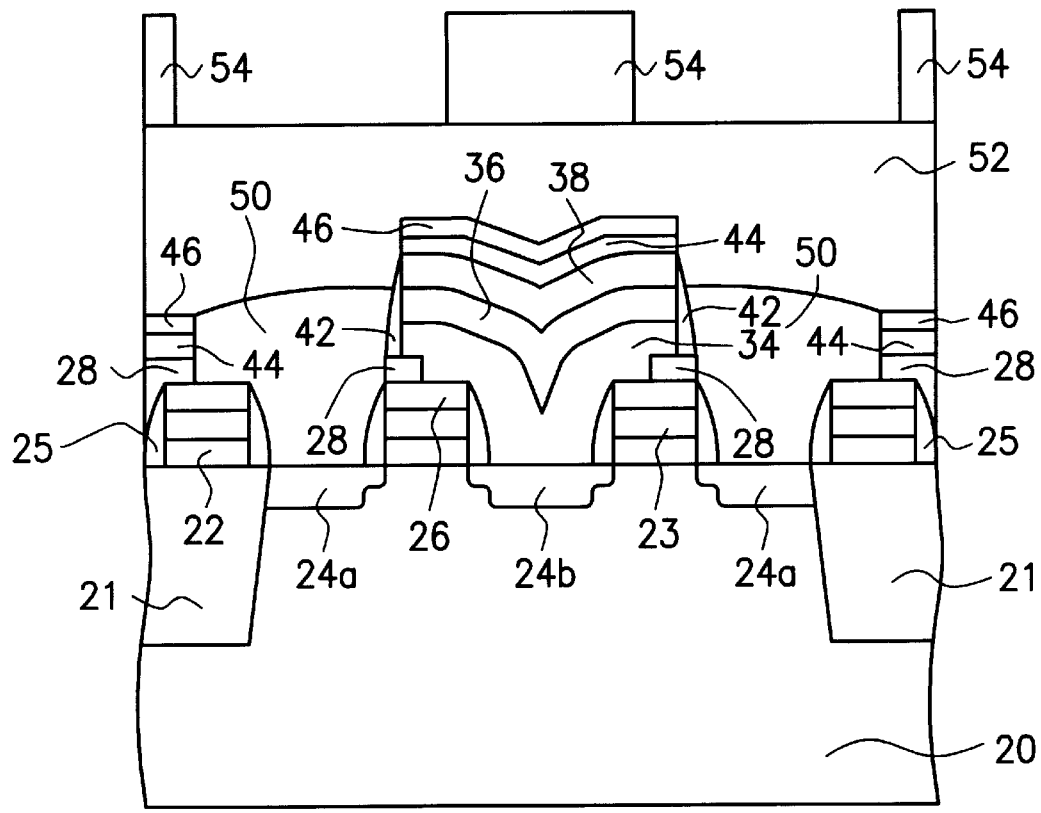
Figure 5L:
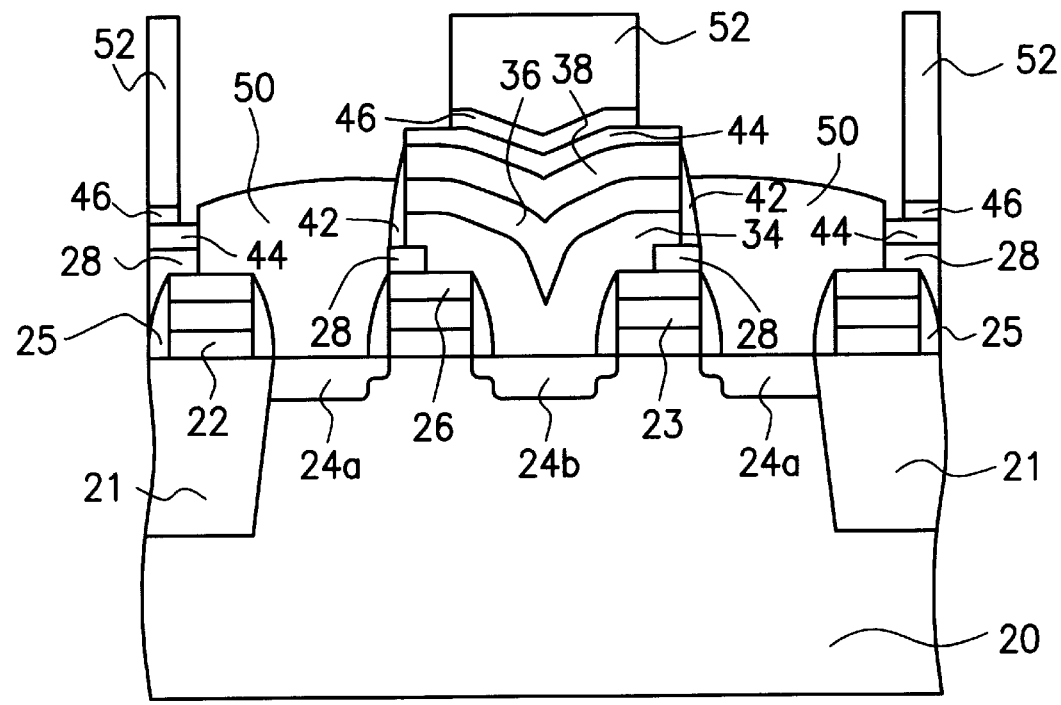
Figure 5M:
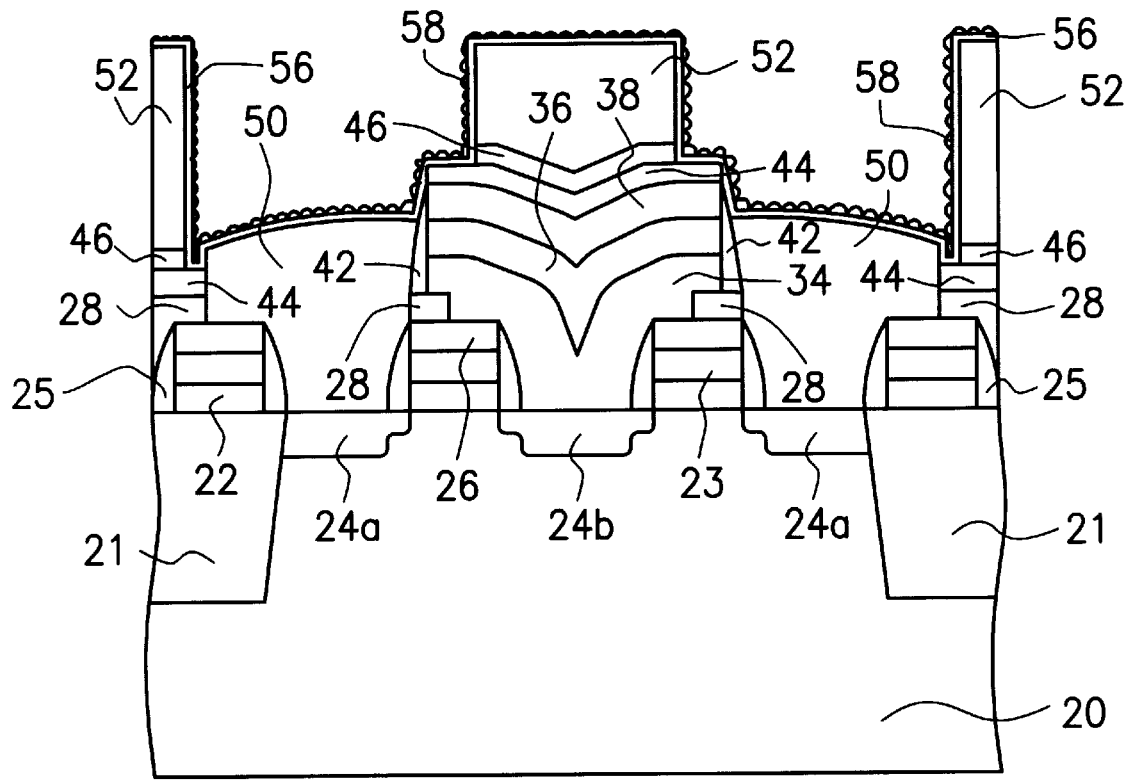
Figure 5N:
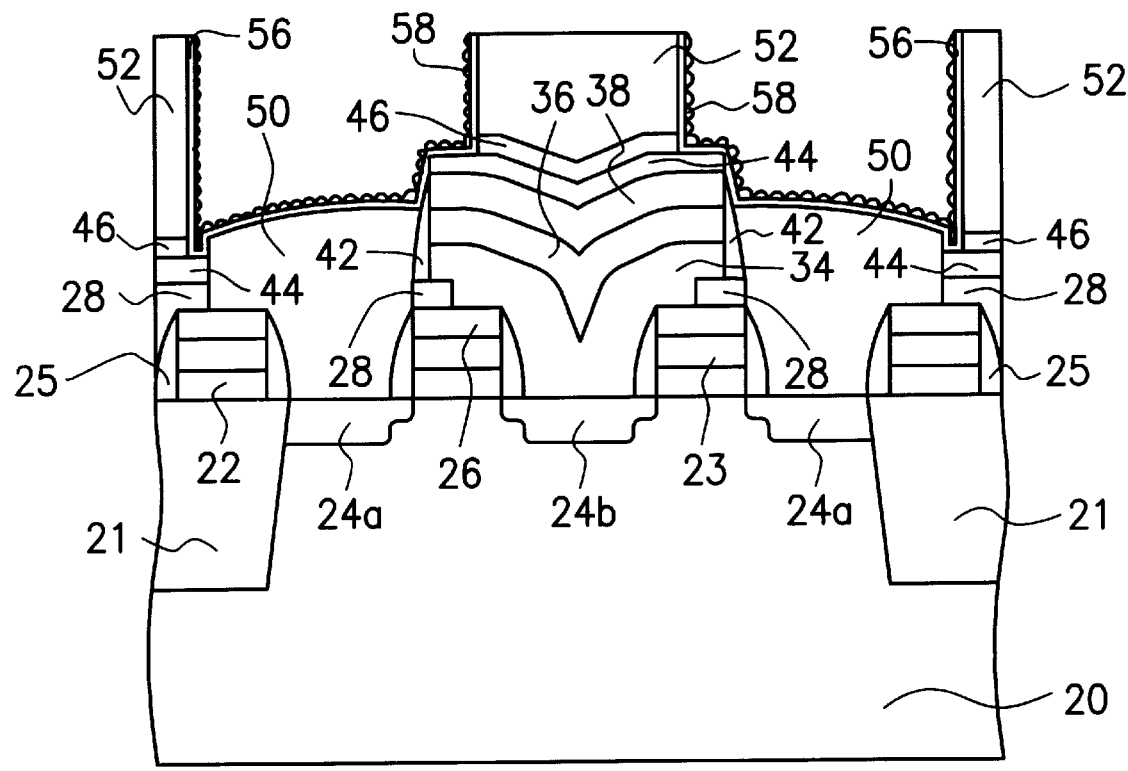
Figure 5O:
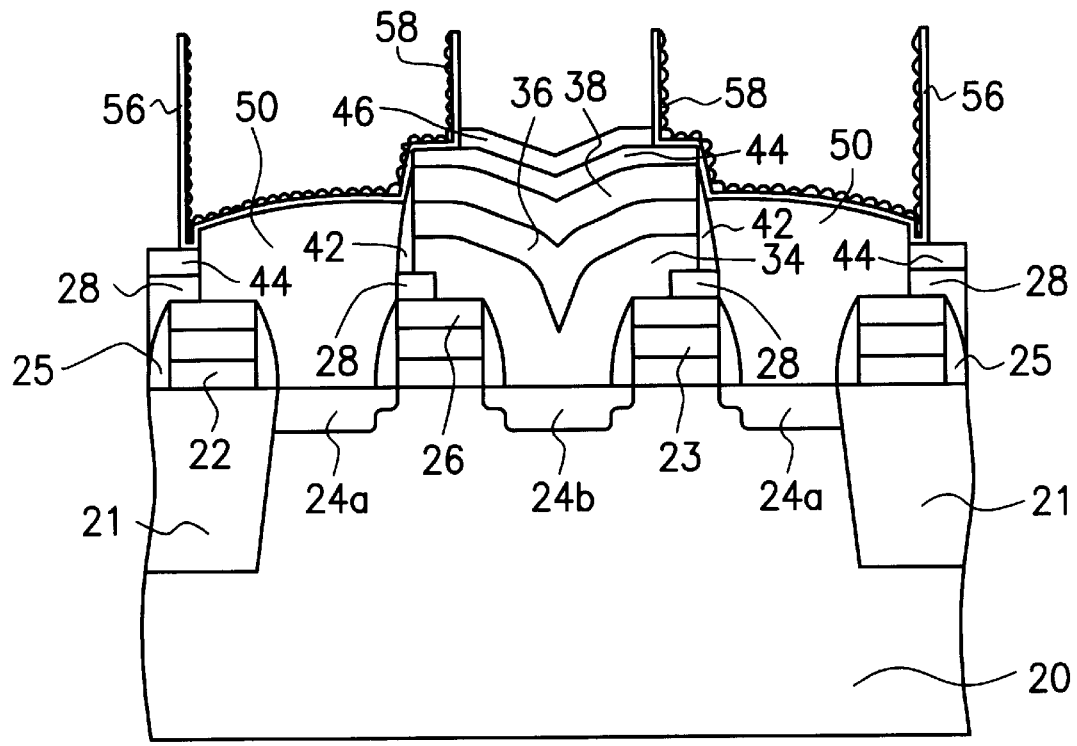
Figure 5P:
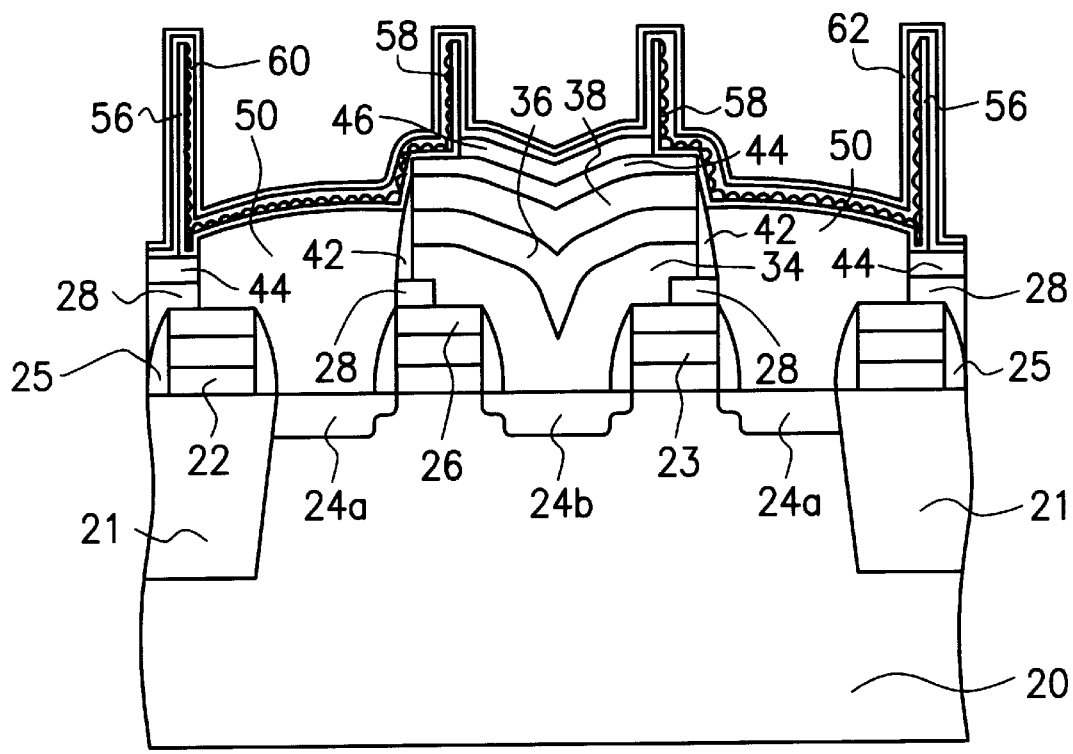

FIG. 5A through 5P are cross-sectional views showing the progression of manufacturing steps for forming a DRAM capacitor according to one preferred embodiment of this invention. First, as shown in FIG. 5A, a semiconductor substrate 20 is provided. Then, shallow trench isolation 21 is formed in the substrate 20 defining an active region. Next, an ion implantation method is used to form a transistor over the active region. The transistor includes a gate electrode and source/drain regions 24a and 24b, wherein the gate electrode further comprises a first polysilicon layer 22, a tungsten suicide layer 23 and a silicon nitride layer 26. The first polysilicon layer 22 has a thickness of about 500 Å to 1500 Å, and preferably 1000 Å. The tungsten suicide layer 23 has a thickness of about 500 Å to 1500 Å, and preferably 1000 Å. The silicon nitride layer 26 preferably has a thickness of about 2000 Å. The first polysilicon layer 22 and the tungsten silicide layer 23 are formed using, for example, a low pressure chemical vapor deposition method. The silicon nitride layer 26 is formed using, for example, a plasma chemical vapor deposition method. In addition, the source/drain regions 24a and 24b are lightly doped prior to forming the spacers.

Next, a silicon nitride layer preferably having a thickness of about 1500 Å is deposited over the whole substrate structure using, for example, a plasma chemical vapor deposition method. Then, the silicon nitride layer is etched back to form spacers 25 on the sidewalls of the gate electrodes and exposing the source/drain regions 24a and 24b on each side of the gate electrode. The etching-back operation is performed using, for example, an anisotropic etching method. Subsequently, using the spacers 25 as masks, highly concentrated impurity ions are implanted into the source/drain regions 24a and 24b. Since the spacers 25 are made from silicon nitride material, these spacers can serve as etching stop layers in subsequent etching operations.

Next, as shown in FIG. 5B, an oxide layer 28 is formed covering the whole substrate structure. The oxide layer 28 can be made from silicon oxide or other oxide material, and preferably having a thickness of about 1000 Å to 2000 Å. The oxide layer 28 is formed using, for example, an atmospheric pressure chemical vapor deposition method. Thereafter, a photoresist layer 30 is coated over the oxide layer 28, then patterned to define a contact opening area for the bit line.

Next, as shown in FIG. 5C, the oxide layer 28 is etched to form a contact opening 32 for the bit line using, for example, a dry etching method. The contact window 32 exposes either one of the source/drain regions 24a and 24b, for example, a drain region 24b. Since silicon nitride spacers 25 formed earlier can serve as an etching stop layer, the contact opening 32 is actually formed by a self-aligned contact (SAC) etching process. After the contact opening 32 is formed, the photoresist layer 30 is removed.

Next, as shown in FIG. 5D, an impurity-doped second polysilicon layer preferably having a thickness of about 1000 Å is formed over the whole substrate structure using, for example, a low pressure chemical vapor deposition method. The second polysilicon layer is deposited into the contact opening 32 in order to connect with the exposed source/drain region, for example, the drain region 24b. Thereafter, a tungsten suicide layer 36 preferably having a thickness of about 1000 Å is deposited over the second polysilicon layer 34 using, for example, a low pressure chemical vapor deposition method. Subsequently, a silicon nitride layer 38 preferably having a thickness of about 2000 Å is deposited over the tungsten silicide layer 36 using, for example, a plasma chemical vapor deposition method. Finally, a photoresist layer 40 is formed covering specified region of the silicon nitride layer 38.

Next, using conventional photolithographic and etching processes, portions of the silicon nitride layer 38, the tungsten silicide layer 36 and the second polysilicon layer 34 not covered by the photoresist layer 40 is etched to form a structure as shown in FIG. 5E, wherein the silicon nitride layer 38, the tungsten silicide layer 36 and the second polysilicon layer 34 together constitute a bit line.

Next, as shown in FIG. 5F, another silicon nitride layer is deposited over the whole substrate structure using, for example, a plasma chemical vapor deposition method. Then, the silicon nitride layer is etched back to form silicon nitride spacers 42 on the sidewalls of the silicon nitride layer 38, the tungsten silicide layer 36 and the second polysilicon layer 34. Since the spacers 42 are made from silicon nitride material, subsequently formed contact opening can have a larger width, and hence allowing a smaller height to width ratio for the contact opening.

Next, as shown in FIG. 5G, yet another silicon nitride layer 44 preferably having a thickness of about 300 Å is deposited over the whole substrate structure using, for example, a plasma chemical vapor deposition method. After that, an oxide layer 46 preferably having a thickness of about 1500 Å is deposited over the silicon nitride layer 44 using, for example, an atmospheric pressure chemical vapor deposition method. Subsequently, the substrate structure is heated to a temperature of about 800° C. to densify the oxide layer 46. Then, a photoresist layer 48 is formed over specified region above the oxide layer 46.

Next, the exposed oxide layer 46 is etched first followed by the silicon nitride layer 44 and the oxide layer 28 beneath the oxide layer 46 to form a contact opening 45 exposing a source/drain region, for example, a source region 24a. Then, the photoresist layer 48 is removed to form the structure as shown in FIG. 5H. Since the spacers 42 on the sidewalls of the gate electrode are made from silicon nitride material, the spacers 42 are able to protect the gate electrode against damages caused by the above etching. Hence, a larger contact opening 45 width can be produced, and a lower height to width ratio can be obtained. Furthermore, the contact opening is formed by a self-aligned contact etching process, thereby preventing etching misalignment due to defocusing.

Next, as shown in FIG. 5I, plug material, such as doped polysilicon, preferably having a thickness of about 2000 Å is deposited over the whole substrate structure to form a polysilicon plug 50 using, for example, a low pressure chemical vapor deposition method. The polysilicon plug 50 connects with the exposed source/drain region, for example, the source region 24a, through the contact opening 45. Next, the polysilicon plug 50 is etched back to form a cross-sectional profile as shown in FIG. 5J. Subsequently, an oxide layer 52, such as a borophosphosilicate glass, preferably having a thickness of about 1500 Å is deposited over the whole substrate structure using, for example, plasma chemical vapor deposition method. The oxide layer 52 is heated causing a reflow at about 800° C., and later polished to form a flat surface using, for example, a chemical-mechanical polishing method.

Next, as shown in FIG. 5K, a photoresist layer 54 is formed over specified region of the oxide layer 52.

Next, as shown in FIG. 5L, the oxide layer 52 not covered by the photoresist layer 54 is etched first, and then the oxide layer 46 beneath it is further etched to form pillar-shaped structure comprising the oxide layers 52 and 46. The silicon nitride layer 44 can serve as an etching stop layer in the etching operation, and so the contact opening is formed in a self-aligned contact etching process. In addition, the silicon nitride spacers 42 can protect the gate electrode against damages due to etching.

Next, as shown in FIG. 5M, a doped third polysilicon layer 56 preferably having a thickness of about 500 Å is deposited over the substrate structure following its cross-sectional profile. Then, hemispherical grained silicon layer 58 can be formed on the surface of the third polysilicon layer 56. Alternatively, the hemispherical grained silicon layer 58 can be formed in a later stage.

Next, as shown in FIG. 5N, that portions of the hemispherical grained silicon layer 58 and the third polysilicon layer 56 above the oxide layer 52 is removed until the oxide layer 52 is exposed using, for example, a chemical-mechanical polishing method. Thereafter, the substrate structure is cleaned in an ONTRACK cleaning machine for about 180 seconds, wherein cleaning agents including ammonium hydroxide solution and diluted hydrofluoric acid solution in a ratio of 100:1 are applied sequentially, and then dried by a spinning method. The hemispherical grained silicon layer 58, referred to in FIG. 5M and described in the previous step, can now be deposited over the third polysilicon layer 56.

Next, as shown in FIG. 5O, the oxide layers 52 and 46 are removed by etching using a buffered oxide etchant (BOE 20.1) for about 400 to 600 seconds. Hence, a pillar-shaped lower electrode of a capacitor comprising a hemispherical grained silicon layer 58 and a third polysilicon layer 56 is formed.

Finally, as shown in FIG. 5P, a dielectric layer 60 is formed over the lower electrode. Then, conductive material, such as doped polysilicon, preferably having a thickness of about 500 Å to 1000 Å is deposited over the dielectric layer 60 to form a fourth polysilicon layer 62. The fourth polysilicon layer 62 functions as an upper electrode of the capacitor. The dielectric layer 60 can be a composite oxide/nitride/oxide (ONO) layer, or a tantalum oxide layer, wherein if the dielectric layer 60 is a tantalum oxide layer, then the fourth polysilicon layer 62 can be either an impurity-doped polysilicon layer or a sequentially formed titanium/titanium nitride stack.

Thereafter, subsequent processes necessary for the forming the capacitor are carried out. However, they are not directly related to the invention, hence detailed description are omitted here.

In this invention, silicon nitride spacers are employed twice not only as an etching stop layer, but is also used as a protective layer for the bit line and the gate electrode during an etching operation. Furthermore, since the etching of the contact opening is a self-aligned process, misalignment due to defocusing can be largely avoided.

In another aspect, using silicon nitride spacers has the advantage of being capable of increasing the width of a contact opening. Hence, a contact opening having a smaller height to width ratio can be produced.

In yet another aspect, the formation of hemispherical grained silicon layer over the pillar-shaped lower electrode allows a lower electrode with a large surface area. Furthermore, if tantalum oxide is used to form the dielectric layer, the capacitance of the capacitor can be increased considerably. Therefore, a capacitor with sufficient capacitance can be provided although the surface area of the storage capacitor is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a DRAM capacitor, comprising the steps of:

forming a transistor over a semiconductor substrate, wherein first spacers are already formed on the sidewalls of the transistor;

forming a first oxide layer over the transistor, then forming a contact opening in the first oxide layer exposing a drain region of the transistor;

forming a bit line connected to the drain region of the transistor, and forming a second silicon nitride layer over the bit line;

forming second spacers on the sidewalls of the bit line;

forming a third silicon nitride layer over the first oxide layer, the bit line and the second spacers;

forming a second oxide layer over the third silicon nitride layer;

patterning the third silicon nitride layer and the second oxide layer to expose a source region of the transistor;

forming a plug connected to the exposed source region;

forming a third oxide layer over the second oxide layer;

patterning the third oxide layer and the second oxide layer to expose the plug and forming a pillar-shaped structure including the third and second oxide layers above the third silicon nitride layer;

forming a polysilicon layer over the pillar-shaped structure;

removing the polysilicon layer at the top of the pillar-shaped structure to expose the pillar-shaped structure below;

removing the exposed pillar-shaped structure to form a polysilicon lower electrode;

forming a dielectric layer over the lower electrode; and forming an upper electrode over the dielectric layer.

2. The method of claim 1, wherein the steps of forming the bit line includes the substeps of:

forming a polysilicon layer over the transistor, such that the polysilicon layer has direct connection with the exposed drain region;

forming a tungsten silicide layer over the polysilicon layer;

forming a second silicon nitride layer over the tungsten silicide layer; and patterning the polysilicon layer, the tungsten silicide layer and the second silicon nitride layer to form the bit line.

3. The method of claim 2, wherein the step of forming the polysilicon layer includes a low pressure chemical vapor deposition method.

4. The method of claim 2, wherein the step of forming the tungsten silicide layer includes a low pressure chemical vapor deposition method.

5. The method of claim 2, wherein the step of forming the second silicon nitride layer includes a plasma chemical vapor deposition method.

6. The method of claim 1, wherein the step of forming the first and the second oxide layer include an atmospheric pressure chemical vapor deposition method.

7. The method of claim 1, wherein the step of forming the third oxide layer includes a plasma chemical vapor deposition method.

8. The method of claim 1, wherein the step of forming the polysilicon layer includes a low pressure chemical vapor deposition method.

9. The method of claim 1, wherein the step of forming the first, the second and the third silicon nitride layers include a plasma chemical vapor deposition method.

10. The method of claim 1, wherein the step of forming the plug includes depositing plug material over the exposed drain region, and then etching back the plug material to form the plug.

11. The method of claim 1, wherein the step of removing the polysilicon layer at the top of the pillar-shaped structure include a chemical-mechanical polishing method.

12. The method of claim 1, wherein after the step of forming the polysilicon layer but before the step of exposing the pillar-shaped structure, further includes forming a hemispherical grained silicon layer over the polysilicon layer.

13. The method of claim 12, wherein the step of removing the polysilicon layer at the top of the pillar-shaped structure further includes removing the hemispherical grained silicon layer to expose the pillar-shaped structure.

14. The method of claim 12, wherein the step of forming the dielectric layer includes depositing the dielectric layer over the hemispherical grained silicon layer.

15. The method of claim 1, wherein after the step of removing the pillar-shaped structure but before the step of forming the dielectric layer, further includes forming a hemispherical grained silicon layer over the polysilicon layer.

16. The method of claim 15, wherein the step of forming the dielectric layer includes depositing the dielectric layer over the hemispherical grained silicon layer.

17. The method of claim 1, wherein the transistor has a structure comprising a stack of sequentially formed polysilicon layer, tungsten silicide layer and first silicon nitride layer, wherein the first silicon nitride layer is the topmost layer.

18. The method of claim 1, wherein the bit line has a structure comprising a stack of sequentially formed polysilicon layer, tungsten silicide layer and second silicon nitride layer, wherein the second silicon nitride layer is the topmost layer.

19. The method of claim 1, wherein the step of forming the first spacers includes depositing silicon nitride.

20. The method of claim 1, wherein the step of forming the second spacers includes depositing silicon nitride.

21. The method of claim 1, wherein the step of forming the third oxide layer includes depositing borophosphosilicate glass.

22. The method of claim 1, wherein the step of forming the dielectric layer includes depositing oxide/nitride/oxide triple layers.

23. The method of claim 1, wherein the step of forming the dielectric layer includes depositing tantalum oxide.

24. The method of claim 23, wherein the step of forming the upper electrode includes depositing a titanium/titanium nitride composite layer.

25. The method of claim 1, wherein the step of forming the plug layer includes depositing polysilicon.

* * * * *